United States Patent [19]

Rasch et al.

[11] Patent Number: 4,543,444

[45] Date of Patent: Sep. 24, 1985

[54] SOLAR-CELL

[75] Inventors: Klaus-Dieter Rasch, Talheim; Helmut Flödl, Bad Friedrichshall, both of Fed. Rep. of Germany

[73] Assignee: Telefunken electronic GmbH, Heilbronn, Fed. Rep. of Germany

[21] Appl. No.: 601,442

[22] Filed: Apr. 18, 1984

[30] Foreign Application Priority Data

May 5, 1983 [DE] Fed. Rep. of Germany ....... 3316417

[51] Int. Cl.[4] .................... H01L 31/06; H01L 31/18
[52] U.S. Cl. ...................................... 136/256; 29/572; 29/589; 29/591; 357/30
[58] Field of Search .......... 136/256; 29/572, 589–591; 357/30

[56] References Cited

U.S. PATENT DOCUMENTS

| 3,411,952 | 11/1968 | Ross et al. | 136/244 |
| 3,421,943 | 1/1969 | Shaikh et al. | 136/256 |
| 4,158,591 | 6/1979 | Avery et al. | 156/643 |
| 4,361,950 | 12/1982 | Amick | 29/572 |

FOREIGN PATENT DOCUMENTS 5619680 of 0000 Japan.

OTHER PUBLICATIONS

R. B. Campbell et al., "Investigation of Contact Metallization Systems for Solar Cells," J. Electrochem. Soc.: Solid-State Science and Technology, vol. 127, No. 12, (Dec. 1980), pp. 2702–2704.

Primary Examiner—Aaron Weisstuch
Attorney, Agent, or Firm—Spencer & Frank

[57] ABSTRACT

A solar cell having a rear side contact and a conduction path system as front side contact. The gist of the invention is that a region of the second conductivity type is disposed on all sides of a semiconductor member of the first conductivity type, and that the rear side contact ohmically contacts the semiconductor member of the first conductivity type by penetrating the region of the second conductivity type.

5 Claims, 1 Drawing Figure

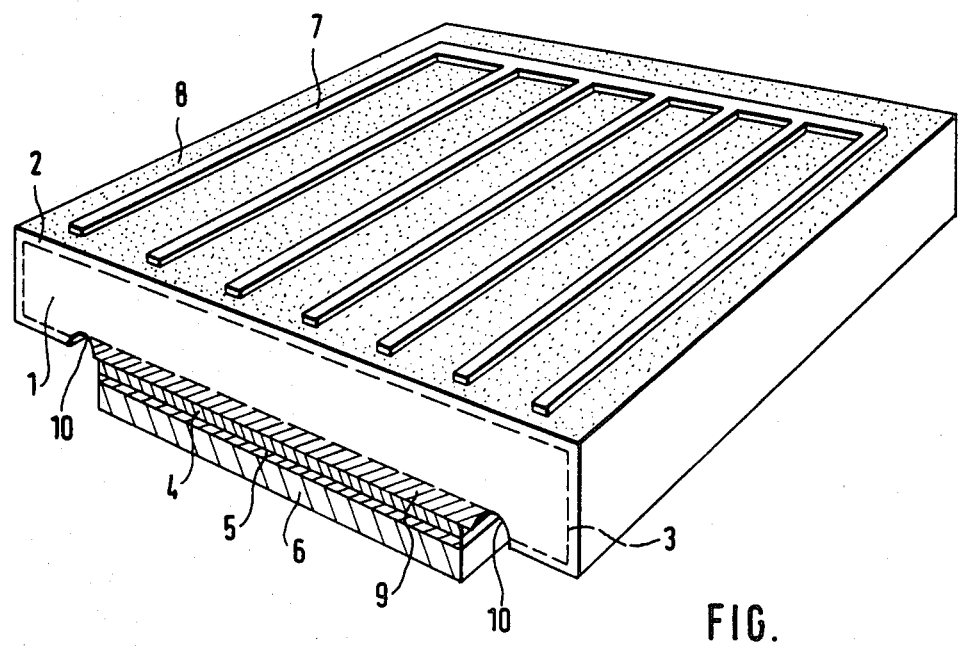
FIG.

SOLAR-CELL

BACKGROUND OF THE INVENTION

The invention relates to a solar cell comprising a wafer-shaped semiconductor member with a rear side contact and with a conduction path system as front side contact. To make a pn-junction in the wafer-shaped semiconductor member, solar cells must be subjected to a diffusion process, whereby a thin surface layer of the conductivity type opposite to that of the semiconductor member is produced. This pn-junction formed between the opposite conductivity type layers may be disposed on all sides of the semiconductor member. To enable the semiconductor member to be contacted on the rear side of the semiconductor wafer, part of the surface layer must then be removed to expose the underlying semiconductor member. On the other hand, it is possible to cover part of the rear side surface of the semiconductor wafer with a diffusion mask, prior to the diffusion process, so that after completion of the diffusion process and removal of the diffusion mask, the rear side contact can be disposed at the unmasked portion on the semiconductor member.

SUMMARY OF THE INVENTION

The object of the invention is to provide a solar cell which is substantially easier to manufacture than prior art cells. According to the invention there is provided a solar cell wherein a region of the second conductivity type is disposed on all sides of a semiconductor member of the first conductivity type, and wherein the rear side contact ohmically contacts the semiconductor member of the first conductivity type by penetrating the region or layer of the second conductivity type.

In the arrangement according to the invention, a pn-junction is therefore disposed on all sides of the semiconductor wafer and is not later removed at the surface areas intended for the rear side contact. The ohmic contacting of the semiconductor member is established by altering the thin surface region of the conductivity type opposite to that of the semiconductor member during an annealing process, after deposition of the rear side contact, so as to produce an ohmic connection between the rear side contact and the semiconductor member. The annealing process and the thickness of a titanium layer must enable the intermetallic bonds formed during the annealing process to penetrate the surface region or layer and the pn-junction adjacent to it.

Starting from the semiconductor member, the rear side contact preferably consists of the layer sequence titanium-palladium-silver. To safely eliminate short circuits in the edge area, the pn-junction outside of but adjacent the rear side contact is severed prior to or following the annealing process. Finally, after completion of the annealing process, the front side contact is produced.

BRIEF DESCRIPTION OF THE DRAWING

The sole FIGURE is a perspective view of a solar cell in accordance with the present invention.

DESCRIPTION OF THE PREFERRED EMBODIMENT

A wafer-shaped semiconductor member 1 made of silicon and having a thickness of approximately 300 $\mu$m and a p-type conductivity of, for example, 1 ohm-cm is illustrated in the FIGURE. A thin, n-type surface region 2 with a conductivity of approximately 50 ohm/□ is disposed on all sides of the semiconductor wafer 1, which may be of round, rectangular, or multi-cornered in configuration. This is preferably done by implantation or diffusion. The pn-junction 3 between the silicon member 1 and the region 2 disposed on it is preferably located 0.2 to 0.5 $\mu$m beneath the semiconductor surface.

When the pn-junction has been produced, the rear side contact, comprising several superimposed metal layers, is applied to the side of the solar cell which is not designed to receive the incident light. The first metal layer 4 preferably consists of titanium and has a thickness of approximately 0.2 $\mu$m. The second layer 5, preferably consisting of palladium, is only about 0.01 to 0.02 $\mu$m thick. The silver layer 6, which is applied last, has a relatively large thickness of 1 to 5 $\mu$m. All of the metal layers may be applied by vapor deposition, sputtering, or deposited by means of chemical reactions.

When the rear side contact has been produced, the solar cell is subjected to an annealing process. With the aforementioned pn-junction penetration depth of 0.2 to 0.5 $\mu$m, an annealing process at 690° C. to 700° C. for a duration of 15 minutes has proven expedient. It has been ascertained that after this annealing process the rear side contact is ohmically connected to the member 1.

This connection is affected by an alloying process or by the formation of an intermetallic bonding region 9 in the solar cell surface area adjacent to the rear side contact. The alloy front, or the front of the intermetallic bonding, extends through the surface region 2 so that the pn-junction becomes ineffective in this area. To safely avoid or eliminate a short circuit between the two regions, the pn-junction is preferably severed in the area surrounding the rear side contact. In accordance with the FIGURE, this may, for example, be effected by producing with a laser beam a groove 10 of annular or frame-shaped configuration surrounding the rear side contact on all sides. Another possibility consists in abrading the edge of the semiconductor wafer in the area of its rear side edge and thereby severing the pn-junction. The severing of the pn-junction in accordance with one of the aforementioned methods may be effected prior to or following the deposition of the contacts.

After the temperature treatment of the solar cell comprising the rear side contact, the front side contact 7 is applied to the front side 8 of the semiconductor wafer, which is designed to receive the incident light. This front side contact consists of a conduction path system which may take the form of a finger structure or a grid structure and should occupy as small a fraction as possible of the surface which can be used to receive the incident light. The front side contact preferably also consists of a titanium-palladium-silver layer sequence. The solar cell may furthermore comprise, in a manner known per se, an antireflection layer and may also be connected to further solar cells to form a solar cell generator for the most varied of purposes.

What is claimed is:

1. A solar cell comprising a wafer-shaped semiconductor member of first conductivity type, said semiconductor member having a rear side with a rear side contact affixed thereto and having a front side with a conduction path system affixed thereto as a front side contact, wherein a region (2) of second conductivity type is disposed on all sides of the semiconductor member (1) of first conductivity type to form a pn-junction, wherein the rear side contact (4, 5, 6) ohmically contacts the semiconductor member (1) of first conductivity type by penetrating the region (2) of the second conductivity type and consists, starting from the semiconductor member, of the layer sequence titanium-palladium-silver, and wherein the pn-junction is severed on said rear side of said semiconductor member along a path that surrounds said rear side contact.

2. Solar cell according to claim 1, wherein the titanium layer (4) is approximately 0.2 $\mu$m, the palladium layer (5) is approximately 0.01 to 0.02 $\mu$m, and the silver layer (6) is approximately 1 to 5 $\mu$m thick.

3. A process for manufacturing a solar cell from a semiconductor member of first conductivity type, said semiconductor member having a front side and a rear side, comprising the steps of:

forming a region of second conductivity type on all sides of said semiconductor member to provide a pn-junction adjacent the surface of the member;

forming a multi-layered rear side contact on said rear side of said semiconductor member by depositing a layer of titanium on the member and by depositing at least one additional layer of another metal on the titanium layer;

annealing the semiconductor member and rear side contact to form an ohmic connection that penetrates said pn-junction; and severing said pn-junction on said rear side of said semiconductor member along a path which surrounds said rear side contact.

4. A process according to claim 3, wherein the region of second conductivity type is approximately 0.2 to 0.5 $\mu$m in thickness, and wherein the annealing step is performed for approximately 15 minutes at a temperature of approximately 700° C.

5. A process according to claim 3, further comprising the step of forming a front side contact on said front side of said member after the annealing step.

* * * * *